(12) United States Patent
Hoeppel et al.

(10) Patent No.: US 10,242,974 B2
(45) Date of Patent: Mar. 26, 2019

(54) METHOD FOR PRODUCING OPTOELECTRONIC SEMICONDUCTOR DEVICES AND OPTOELECTRONIC SEMICONDUCTOR DEVICE

(71) Applicant: OSRAM Opto Semiconductors GmbH, Regensburg (DE)

(72) Inventors: Lutz Hoeppel, Alteglofsheim (DE); Juergen Moosburger, Lappersdorf (DE); Andreas Ploessl, Regensburg (DE); Patrick Rode, Regensburg (DE); Peter Nagel, Regensburg (DE); Dominik Scholz, Regensburg (DE)

(73) Assignee: OSRAM OPTO SEMICONDUCTORS GMBH, Regensburg (DE)

(*) Notice: Subject to any disclaimer, the term of this patent is extended or adjusted under 35 U.S.C. 154(b) by 0 days.

(21) Appl. No.: 15/113,749

(22) PCT Filed: Jan. 21, 2015

(86) PCT No.: PCT/EP2015/051115
§ 371 (c)(1),
(2) Date: Jul. 22, 2016

(87) PCT Pub. No.: WO2015/110460
PCT Pub. Date: Jul. 30, 2015

(65) Prior Publication Data
US 2017/0005079 A1   Jan. 5, 2017

(30) Foreign Application Priority Data

Jan. 23, 2014 (DE) .................. 10 2014 100 772

(51) Int. Cl.
*H01L 33/00* (2010.01)
*H01L 31/12* (2006.01)
(Continued)

(52) U.S. Cl.
CPC .......... *H01L 25/167* (2013.01); *H01L 25/50* (2013.01); *H01L 31/02327* (2013.01);
(Continued)

(58) Field of Classification Search
CPC .......... H01L 25/167; H01L 31/02327; H01L 31/147; H01L 31/18; H01L 33/58;
(Continued)

(56) References Cited

U.S. PATENT DOCUMENTS 6,417,019 B1 * 7/2002 Mueller ............. C09K 11/7731
257/100
9,166,126 B2 * 10/2015 Donofrio ............. H01L 33/508
(Continued)

FOREIGN PATENT DOCUMENTS

EP        2642535 A2    9/2013
JP     2012248672 A    12/2012
(Continued)

*Primary Examiner* — Ismail A Muse
(74) *Attorney, Agent, or Firm* — McDermott Will & Emery LLP

(57) ABSTRACT

A method for producing a plurality of optoelectronic semiconductor components (100) is provided, comprising the following steps: a) providing an auxiliary carrier (2); b) providing a plurality of semiconductor chips (10), wherein each of the semiconductor chips has a carrier body (12) and a semiconductor body (4) arranged on an upper side (22) of the carrier body; c) attaching the plurality of semiconductor chips on the auxiliary carrier, wherein the semiconductor chips are spaced apart from one another in a lateral direction (L) and wherein the semiconductor bodies are facing the auxiliary carrier, as seen from the carrier body; d) forming a scattering layer (18), at least in regions between the semiconductor bodies of adjacent semiconductor chips; e) forming a composite package (20); f) removing the auxiliary carrier (2); and g) individually separating the composite
(Continued)

Figure 1:
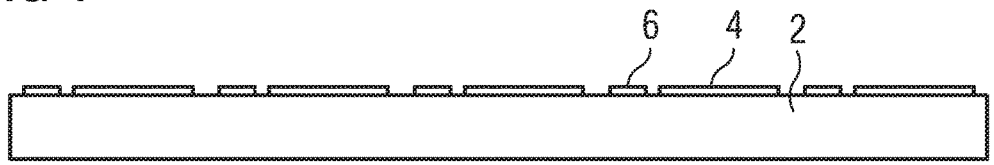

package into a plurality of optoelectronic semiconductor components (100).

14 Claims, 3 Drawing Sheets

(51) Int. Cl.
  *H01L 29/267*   (2006.01)
  *H01L 27/15*   (2006.01)
  *H01L 25/16*   (2006.01)
  *H01L 33/48*   (2010.01)
  *H01L 25/00*   (2006.01)
  *H01L 31/0232*   (2014.01)
  *H01L 31/147*   (2006.01)
  *H01L 31/18*   (2006.01)
  *H01L 33/58*   (2010.01)

(52) U.S. Cl.
  CPC .......... *H01L 31/147* (2013.01); *H01L 31/18* (2013.01); *H01L 33/486* (2013.01); *H01L 33/58* (2013.01); *H01L 2224/96* (2013.01); *H01L 2933/0033* (2013.01); *H01L 2933/0091* (2013.01)

(58) Field of Classification Search
  CPC ... H01L 25/50; H01L 33/486; H01L 2224/96; H01L 2933/0033; H01L 2933/0091
  See application file for complete search history.

(56) References Cited

U.S. PATENT DOCUMENTS

| | | | | |
|---|---|---|---|---|
| 9,252,342 | B2* | 2/2016 | Pachler | H01L 33/60 |
| 9,406,646 | B2* | 8/2016 | Hosseini | H01L 29/402 |
| 9,490,398 | B2* | 11/2016 | Oyamada | H01L 33/50 |
| 2008/0290351 | A1* | 11/2008 | Ajiki | H01L 25/0753 |
| | | | | 257/88 |
| 2009/0160045 | A1* | 6/2009 | Sun | H01L 21/568 |
| | | | | 257/699 |
| 2010/0051984 | A1 | 3/2010 | West | |
| 2011/0012141 | A1* | 1/2011 | Le Toquin | H01L 33/502 |
| | | | | 257/89 |
| 2011/0062466 | A1* | 3/2011 | Tanaka | C30B 19/00 |
| | | | | 257/94 |
| 2011/0248287 | A1* | 10/2011 | Yuan | H01L 33/60 |
| | | | | 257/88 |
| 2012/0193649 | A1* | 8/2012 | Donofrio | H01L 25/0753 |
| | | | | 257/88 |
| 2012/0313074 | A1* | 12/2012 | Schubert | H01L 33/502 |
| | | | | 257/13 |
| 2013/0063024 | A1* | 3/2013 | Wada | H01L 33/56 |
| | | | | 313/512 |
| 2013/0168647 | A1* | 7/2013 | Diekmann | F21S 6/002 |
| | | | | 257/40 |
| 2013/0187178 | A1 | 7/2013 | Tischler | |
| 2013/0337719 | A1* | 12/2013 | Chen | H01L 33/58 |
| | | | | 445/23 |
| 2014/0374786 | A1* | 12/2014 | Bierhuizen | B29C 43/18 |
| | | | | 257/98 |
| 2015/0050760 | A1* | 2/2015 | Imazu | H01L 33/50 |
| | | | | 438/27 |
| 2015/0200336 | A1* | 7/2015 | Bhat | H01L 33/486 |
| | | | | 257/98 |
| 2015/0207046 | A1* | 7/2015 | Ikegami | H01L 33/508 |
| | | | | 257/98 |
| 2015/0295154 | A1* | 10/2015 | Tu | H01L 33/0079 |
| | | | | 438/27 |
| 2015/0311405 | A1* | 10/2015 | Oyamada | H01L 33/50 |
| | | | | 257/98 |
| 2015/0323711 | A1* | 11/2015 | Bessho | G02B 5/0242 |
| | | | | 349/71 |
| 2016/0093782 | A1* | 3/2016 | Vampola | H01L 33/02 |
| | | | | 257/98 |
| 2016/0172554 | A1* | 6/2016 | Basin | H01L 33/0079 |
| | | | | 257/88 |
| 2017/0098742 | A1* | 4/2017 | Ikegami | H01L 33/502 |

FOREIGN PATENT DOCUMENTS

| | | |
|---|---|---|
| JP | 2012253223 A | 12/2012 |
| JP | 2014003283 A | 1/2014 |
| KR | 1020100044401 A | 4/2010 |

* cited by examiner

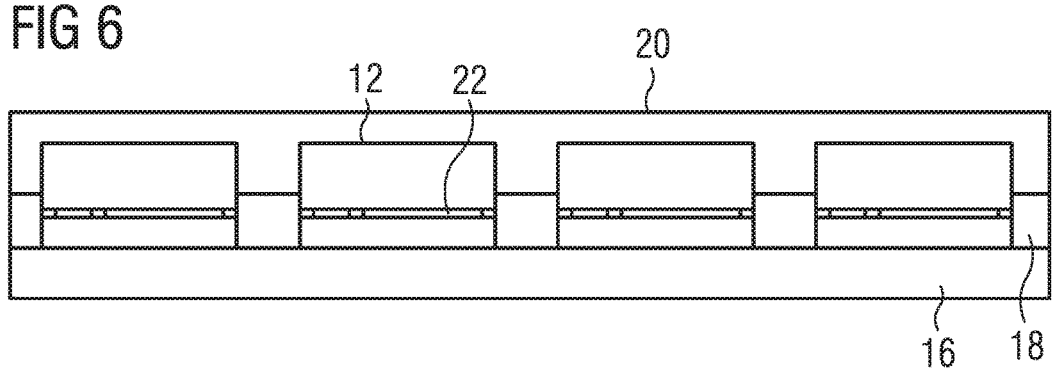
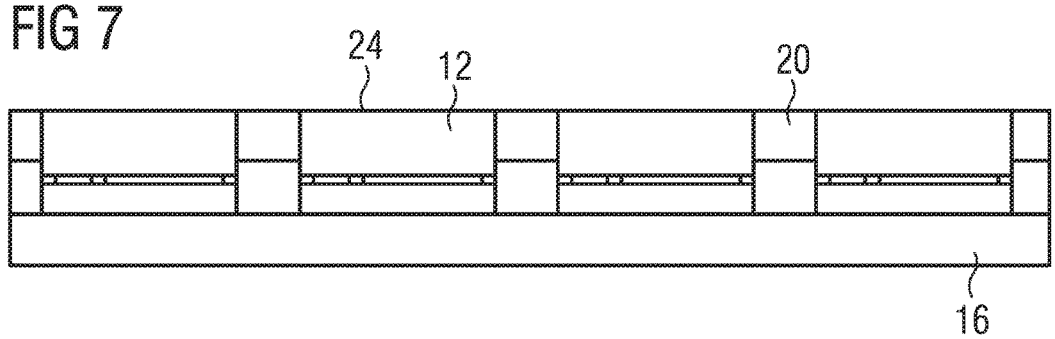
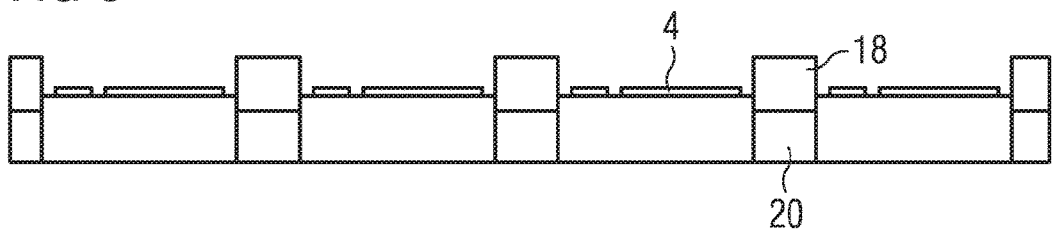
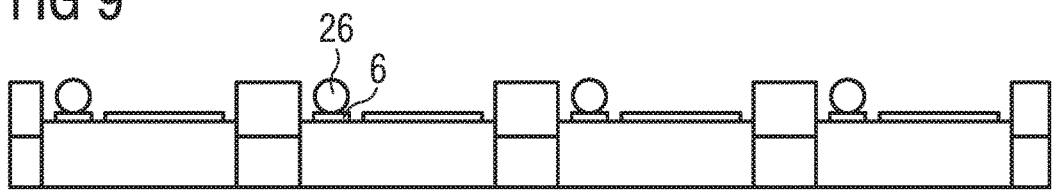
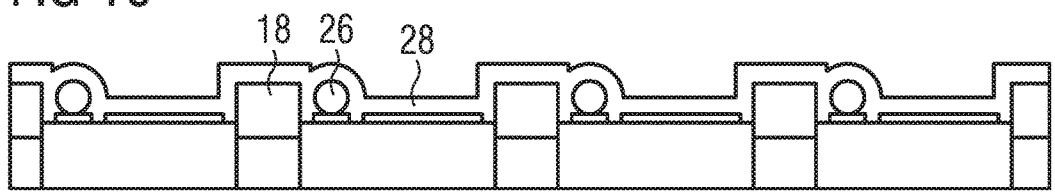

METHOD FOR PRODUCING OPTOELECTRONIC SEMICONDUCTOR DEVICES AND OPTOELECTRONIC SEMICONDUCTOR DEVICE

This patent application claims priority from German patent application 102014100772.7, the disclosure content of which is hereby included by reference.

Arrangements are known for semiconductor devices such as light-emitting diodes in which the semiconductor chips provided for generating radiation are mounted in prefabricated packages. It is difficult to miniaturize such arrangements to produce particularly compact light-emitting diodes.

A solution to this problem, as known from the prior art, consists in forming a package body composite which is arranged between semiconductor chips arranged in the manner of a matrix. The package body composite may for example be produced using a casting method. In a subsequent method step, the package body composite is singulated into a plurality of optoelectronic semiconductor devices, such that each singulated semiconductor device comprises at least one semiconductor chip and a part of the package body composite as package body.

In this case, the problem arises that the package body composite and thus also the package body formed from the package body composite are highly absorbing, i.e. substantially black. This is disadvantageous when using semiconductor chips which emit a large or at least non-negligible proportion of light via their side flanks, since this impinges on the package body and is immediately absorbed.

It is moreover disadvantageous that in semiconductor devices which have a conversion layer arranged downstream of the semiconductor chip, light impinges on the adjacent package body through scattering in the conversion layer and is likewise absorbed to a considerable extent.

In this way, the light emission of the semiconductor device is reduced. Moreover, the material of the package body often fades and becomes porous and brittle, whereby the device may also become mechanically unstable. To prevent this light-induced aging, comprehensive suppression of the lateral emission of the semiconductor chip or appropriate protection of the package body is therefore necessary.

One object is to provide a production method by means of which optoelectronic semiconductor devices may be produced which are of compact design and have high outcoupling efficiency. Furthermore, such a semiconductor device is to be provided.

In particular, one object is as far as possible to stop the absorption of light due to the above-described mechanisms as well as light-induced damage to the package body.

These objects are achieved inter alia respectively by a method and a semiconductor device according to the independent claims. Configurations and convenient aspects constitute the subject matter of the dependent claims.

A method is provided for producing a plurality of optoelectronic semiconductor devices. According to at least one embodiment of the method, the method comprises a step in which an auxiliary carrier is provided. The auxiliary carrier may be configured to be flexible, for example in the form of a foil, or to be rigid.

According to at least one embodiment of the method, the method comprises a step in which a plurality of semiconductor chips is provided. The semiconductor chips in particular comprise a semiconductor body with an active region provided for generating radiation. The semiconductor body, in particular the active region, contains for example a III-V compound semiconductor material. Furthermore, the semiconductor chip comprises a carrier body, on the top of which the semiconductor body is arranged. The top of the carrier body is hereinafter always used to denote the side of the carrier body on which the semiconductor body is arranged.

The statement that a layer or an element is arranged or applied "on" or "over" another layer or another element may here and hereinafter mean that the one layer or the one element is arranged in direct mechanical and/or electrical contact with the other layer or the other element. It may moreover also mean that the one layer or the one element is arranged indirectly on or over the other layer or the other element. In this case, further layers and/or elements may then be arranged between the one layer and the other.

The carrier body is for example a growth substrate for the semiconductor layers of the semiconductor body. Alternatively, the carrier body is different from a growth substrate for the semiconductor layers of the semiconductor body. In this case, the carrier body serves in mechanical stabilization of the semiconductor body, such that the growth substrate is not necessary therefore and may be removed. A semiconductor chip from which the growth substrate has been removed is also known as a thin-film semiconductor chip. For example, the carrier body may contain or consist of silicon, germanium or a metal.

According to at least one embodiment of the method, the method comprises a step in which the plurality of semiconductor chips is mounted on the auxiliary carrier, wherein the semiconductor bodies face the auxiliary carrier when viewed from the carrier body. The preferably optoelectronic semiconductor chips are spaced from one another in a lateral direction. A lateral direction is understood here and hereinafter to mean a direction parallel to a main plane of extension of the auxiliary carrier and/or of the semiconductor body. A vertical direction is understood here and hereinafter analogously to mean a direction perpendicular to a main plane of extension of the auxiliary carrier and/or of the semiconductor body. For example, the auxiliary carrier may be formed to be an adhesive foil to which the semiconductor chips adhere. The plurality of semiconductor chips do not however necessarily have to be arranged directly on the auxiliary carrier. It is sufficient for the semiconductor chips to be arranged for example on an adhesive layer which covers the auxiliary carrier, such that they are mounted at least indirectly on the auxiliary carrier.

According to at least one embodiment of the method, the method comprises a step in which a scattering layer is formed at least in regions between the semiconductor bodies of adjacent semiconductor chips. The scattering layer preferably consists of a radiation-stable material and is configured to be non-absorbing and non-transparent. The scattering layer is preferably configured to be reflective. In particular, the scattering layer may have the function of a reflective layer. The scattering layer preferably has a thickness of between 10 µm and 150 µm, particularly preferably of between 50 µm and 100 µm. Preferably, moreover, the scattering layer comprises scattering particles for example of $TiO_2$. These may for example be embedded in a matrix material such as silicone in particle concentrations of up to 60%, preferably between 25 and 40%.

According to at least one embodiment of the method, the scattering layer completely surrounds the semiconductor bodies in a lateral direction. This does not mean that the scattering layer necessarily directly adjoins the semiconductor bodies. Rather, further elements may be arranged between the scattering layer and the semiconductor bodies. Nevertheless, light emitted by the semiconductor bodies of the finished devices impinges in every lateral direction on the scattering layer, such that direct irradiation of the package body is prevented at least in the lateral directions.

According to at least one embodiment of the method, the method comprises a step in which a package body composite is formed, which is arranged at least in places between the carrier bodies of adjacent semiconductor chips. In this case, the tops of the carrier bodies are at a smaller distance from the auxiliary carrier than the package body composite.

This ensures that in the finished device laterally emitted light does not impinge directly on the package body, which, when viewed from the semiconductor body, is located below or behind the top of the carrier body. Instead, an extension of the propagation path of the light towards the surface of the package body is achieved. The scattering layer additionally minimizes the radiation impinging on the package body.

Preferably, a vertical distance between the tops of the carrier bodies and the package body composite is greater than 5 µm. In particular, it is preferable that a distance between the tops of the carrier bodies and a top of the package body composite is greater than 5 µm. A top of the package body composite is here understood to mean a side which faces the semiconductor body of the semiconductor chips.

The package body composite may in particular be produced using a casting method. The term casting method here covers all production methods in which a molding composition is introduced into a predetermined mold and in particular is subsequently cured. In particular, the term casting method encompasses casting, injection molding, transfer molding and compression molding. The package body composite is preferably formed by compression molding or by film assisted transfer molding.

The package body composite may comprise filled or unfilled casting resins (e.g. epoxy resins or silicones). The package body composite may comprise a thickness of between 50 µm and 500 µm, preferably of between 100 µm and 200 µm, typically of around 150 µm.

The package body composite may for example be formed by a black material. For example, the package body composite may contain or consist of a black epoxide material ("black epoxy"). Such a material is particularly inexpensively available due to its being widely used in the electronics industry and is distinguished by good processability. An epoxide material may furthermore have the advantage that its coefficient of thermal expansion differs only slightly from that of the material of the carrier body.

The package body composite and thus also the package bodies formed from the package body composite in a later method step are in particular configured to be radiation-opaque, and in particular configured to be at least partially or completely absorbing, for the radiation to be detected or emitted by the semiconductor chip when the semiconductor device is in operation.

In the method step described, the scattering layer bonds in form-fitting manner with the casting material used in formation of the package body composite.

According to at least one embodiment of the method, the method comprises a step in which the auxiliary carrier is removed, for example by being delaminated.

According to at least one embodiment of the method, the method comprises a step in which the package body composite is singulated into a plurality of optoelectronic semiconductor devices, wherein each semiconductor device has at least one semiconductor chip, a part of the reflecting layer and a part of the package body composite as package body. The package body is preferably configured to be at least partially or completely absorbing.

The package bodies thus arise from the package body composite only on singulation and therefore at a time when the semiconductor chips are already located in the package body. A consequence of the singulation of the package body composite is that side faces of the resultant optoelectronic semiconductor devices are not covered by the reflective layer at least in the region of the package body, i.e. are free of the reflective layer.

According to at least one embodiment of the method, the semiconductor chips provided prior to mounting on the auxiliary carrier comprise a sacrificial layer, which is arranged on the top of the carrier body and covers a side of the semiconductor body remote from the carrier body. The plurality of the semiconductor chips are here mounted on the auxiliary carrier in such a way that the sacrificial layers are in each case arranged between the carrier bodies and the auxiliary carrier. Preferably, the sacrificial layers directly adjoin the auxiliary carrier. Each of the sacrificial layers is removed prior to the singulation step, such that the finished semiconductor device is free of the material of the sacrificial layer.

The sacrificial layers act as spacers on the auxiliary carrier and allow the scattering layer to be arranged between the semiconductor chips in such a way that, in the finished semiconductor device, it projects beyond the semiconductor body in a vertical direction away from the package body and thus forms a frame surrounding the semiconductor body. The sacrificial layer preferably consists of a material, which may be simply removed by a chemical or physical method. For example, the sacrificial layer may consist of a photoresist, which may be easily dissolved through the action of a suitable solvent, such as for example water. The sacrificial layers each preferably have a thickness of at least 30 µm, particularly preferably of at least 50 µm.

Because the tops of the carrier bodies are at a smaller distance from the auxiliary carrier than is the package body composite, it is generally the case that the scattering layer has a greater thickness than the sacrificial layers.

According to at least one embodiment of the method, the method comprises a step in which, after removal of the auxiliary carrier, a conversion layer is formed and each of the singulated semiconductor devices comprises a part of the conversion layer. The conversion layer is in particular formed to convert primary radiation with a first wavelength (for example from the blue region of the spectrum) generated in the semiconductor chips into secondary radiation with a longer wavelength different from the first wavelength (for example from the yellow region of the spectrum). For example, the semiconductor device is provided for generating mixed light, in particular mixed light which appears white to the human eye.

The conversion layer preferably has a thickness which is less than or equal to the thickness of the sacrificial layers. For example, the conversion layer has a thickness of between 20 µm and 150 µm, particularly preferably between 40 µm and 100 µm.

According to at least one embodiment of the method, the conversion layer is formed by spray coating and for example contains a silicone with a suitable viscosity for making it easy to spray. Moreover, suitable conversion particles may be embedded in the silicone.

According to at least one embodiment of the method, the method comprises a step in which, after removal of the auxiliary carrier and optionally of the sacrificial layers, contacting elements are formed, which are each connected electrically conductively with at least one part of the semiconductor bodies. Preferably, the contacting elements project beyond the scattering layer in a vertical direction away from the carrier. The contacting elements formed for example as "bumps" allow contacting of the semiconductor chips from a top of the finished devices, and in particular through a conversion layer and/or through a planarization layer, which must conventionally be provided to equalize the differences in height arising as a result of the scattering layer projecting above the semiconductor bodies. Without the contacting elements, contacting of the semiconductor bodies would only be possible with difficulty through placing bonding wires over the scattering layer configured as a frame. An embodiment without the described contacting elements is however also conceivable, in which contact tracks are applied using planar technology in such a way that they cover over the scattering layer. In this case it must be ensured that the contact tracks applied in this way are failsafe and in particular do not tear under mechanical load at the points covered over.

According to at least one embodiment of the method, the method comprises a step in which the semiconductor chips are covered over when the package body composite is formed and the package body composite is subsequently thinned, such that the carrier bodies and in particular the backs of the carrier bodies are exposed in places.

According to at least one embodiment, an optoelectronic semiconductor device comprises a semiconductor chip provided for generating and/or receiving radiation with a semiconductor body arranged on a top of a carrier body.

According to at least one embodiment of the optoelectronic semiconductor device, the semiconductor device comprises a package body which surrounds the carrier body of the semiconductor chip in places in a lateral direction. The top of the carrier body is arranged in front of the package body when viewed in a vertical direction from the semiconductor body. The package body is preferably configured to be at least partially or completely absorbing.

According to at least one embodiment of the optoelectronic semiconductor device, a scattering layer is arranged on the package body, which scattering layer completely surrounds the semiconductor body in a lateral direction.

According to at least one embodiment of the optoelectronic semiconductor device, a vertical distance between the top of the carrier body and the package body is greater than 5 µm, preferably greater than 10 µm.

According to at least one embodiment of the optoelectronic semiconductor device, side faces of the package body are not covered by the scattering layer.

According to at least one embodiment of the optoelectronic semiconductor device, the scattering layer projects beyond the semiconductor body by at least 20 µm in a vertical direction away from the package body.

The above-described method for producing optoelectronic semiconductor devices is particularly suitable for producing the optoelectronic semiconductor device. Features listed in connection with the method may therefore also be used for the semiconductor device or vice versa.

Further features, configurations and convenient aspects are revealed by the following description of the exemplary embodiments in conjunction with the figures.

Identical, similar or identically acting elements are provided with the same reference numerals in the figures.

The figures and the size ratios of the elements illustrated in the figures relative to one another are not to be regarded as being to scale. Rather, individual elements and in particular layer thicknesses may be illustrated on an exaggeratedly large scale for greater ease of depiction and/or better comprehension.

Figure 13:
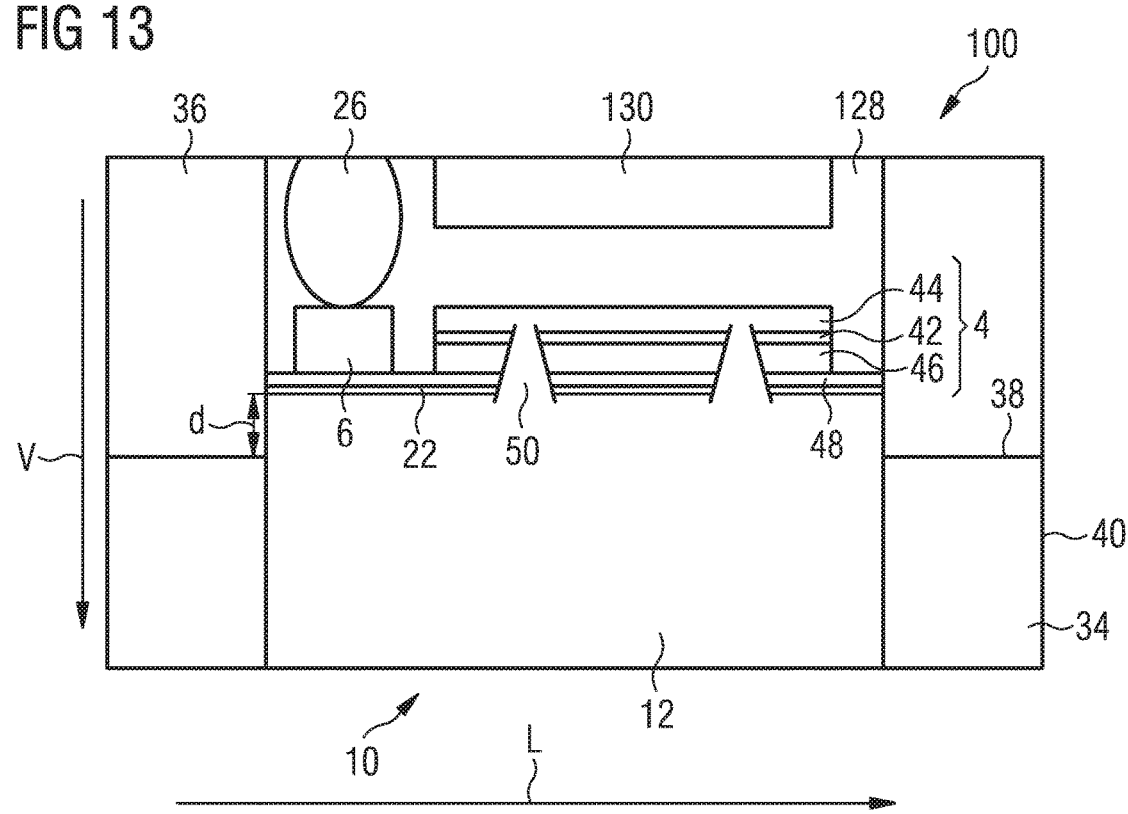

In the figures:

FIGS. 1 to 12 show an exemplary embodiment of a method for producing optoelectronic semiconductor devices on the basis of intermediate steps shown in each case in schematic sectional view; and FIG. 13 shows an exemplary embodiment of an optoelectronic semiconductor device.

FIGS. 1 to 12 show an exemplary embodiment of a method for producing a plurality of optoelectronic semiconductor devices. As shown in FIG. 1, first of all a carrier composite 2 is provided, on which are arranged a plurality of semiconductor bodies 4 and of contacts 6 connected electrically therewith. More precisely, the contacts 6 are connected with a reflective layer not shown in FIG. 1, which is arranged between the carrier composite 2 and the semiconductor bodies 4.

Figure 2:
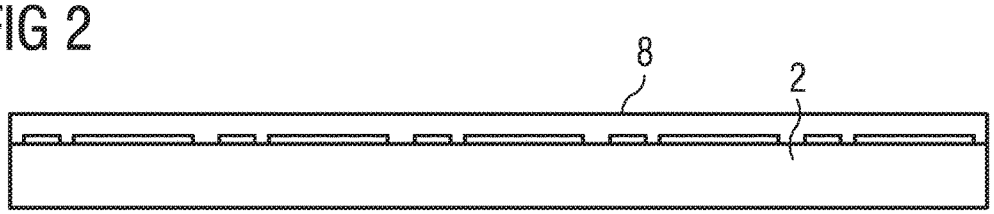

As shown in FIG. 2, a large-area sacrificial layer 8, which may consist for example of a photoresist and have a thickness of at least 20 µm, is subsequently applied.

Figure 3:
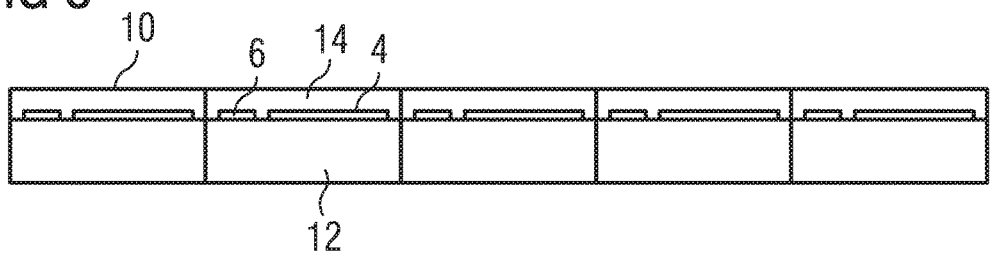

In the method step shown in FIG. 3, the carrier composite 2 is singulated into a plurality of semiconductor chips 10, which in particular are configured to be thin-film semiconductor chips. Each of the semiconductor chips 10 provided in this way comprises a carrier body 12, a semiconductor body 4 arranged on a top of the carrier body 12, a contact 6 and a sacrificial layer 14.

Figure 4:
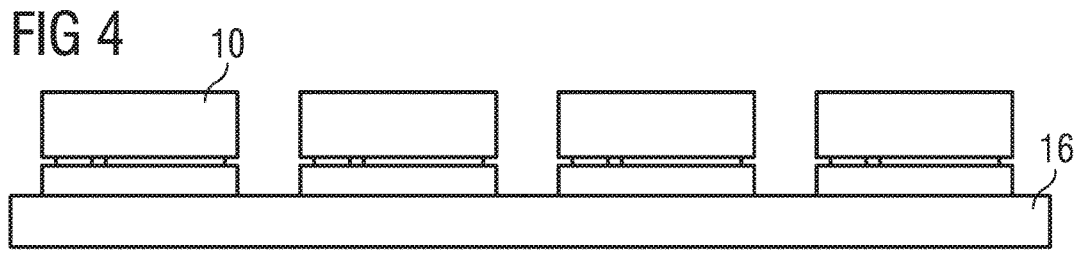

In the method step illustrated in FIG. 4, the plurality of singulated semiconductor chips 10 are mounted on an auxiliary carrier 16. In this case, the semiconductor chips 10 are arranged in such a way on the auxiliary carrier 16 that the semiconductor bodies 4 face the auxiliary carrier 16 when viewed from the carrier bodies 12. A self-adhesive foil is for example suitable for the auxiliary carrier 16. Alternatively, the semiconductor chips 10 may also be mounted by means of a temporary adhesive. The semiconductor chips 10 are arranged in the manner of a matrix and are spaced from each other in a lateral direction, i.e. in a direction parallel to the main plane of extension of the auxiliary carrier 16.

The description below relates to radiation-emitting semiconductor devices, by way of example. The semiconductor chips 10 are for example luminescent diode semiconductor chips, for instance light-emitting diode semiconductor chips. In contrast thereto, the semiconductor devices 10 may however also be provided for receiving radiation and for example comprise a semiconductor chip configured as a photodiode.

Figure 5:
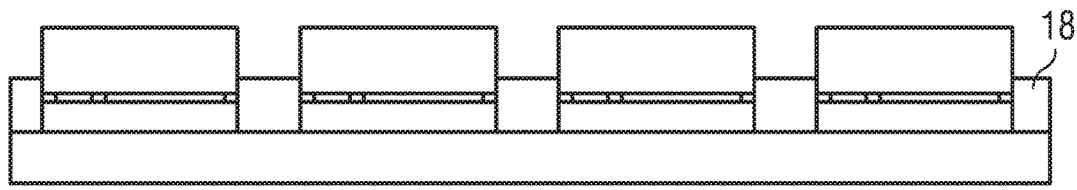

In the method step shown in FIG. 5, a scattering layer 18, which for example has a silicone matrix in which scattering particles of titanium dioxide are embedded, is applied to the side of the auxiliary carrier 16 on which the semiconductor chips 10 are mounted. The scattering layer 18 here covers regions of the auxiliary carrier 16 which lie between the semiconductor chips 10. Moreover, the thickness of the scattering layer 18 is selected such that it completely surrounds the semiconductor bodies 4 in a lateral direction. This does not mean that the scattering layer 18 directly adjoins the semiconductor bodies 4. For example, the contacts 6 are arranged between the semiconductor bodies 4 and the scattering layer 18. However, a sub-region of the scattering layer 18 is arranged in every lateral direction when viewed from the semiconductor bodies 4. The scattering layer 18 here has a greater thickness than the plurality of sacrificial layers 14, for example a thickness of more than 50 µm.

In the subsequent method step shown in FIG. 6, a package body composite 20 is produced by compression molding, which composite is arranged on the scattering layer 18 and fills in regions between the carrier bodies 12 of adjacent semiconductor chips 10 at least in places. The tops 22 of the carrier bodies 12 are here at a smaller distance from the auxiliary carrier 16 than is the package body composite 20.

In the subsequent method step shown in FIG. 7, the package body composite 20 is thinned from the side remote from the auxiliary carrier 16, for example by means of a mechanical method such as grinding, such that the backs 24 of the carrier bodies 12 are exposed.

In the method step shown in FIG. 8, the auxiliary carrier 16 is removed by delamination. Moreover, the sacrificial layers 14 are removed for example by application of a solvent, such that only the scattering layer 18 remains above the semiconductor bodies 4, said scattering layer 18 projecting beyond the semiconductor bodies 4 in a vertical direction away from the package body composite 20 and surrounding the semiconductor bodies 4 in the manner of a frame.

In the method step illustrated in FIG. 9, contacting elements 26 in the form of bumps are formed, which are each arranged on the contacts 6 and thus produce an electrically conductive connection with at least one part of the semiconductor bodies 4. The contacting elements 26 here project beyond the scattering layer 18 in a vertical direction away from the carrier body 12. In this way, in the finished devices an advantageous configuration of the contact fingers provided for contacting is achieved, said contact fingers being capable of extending in a substantially planar manner, since the contacting elements 26 may also be contacted across the scattering layer 18 from a lateral direction.

In the method step illustrated in FIG. 10, spray coating is used to form a conversion layer 28, which covers the scattering layer 18, the contacting elements 26 and the semiconductor bodies 4.

Figure 11:
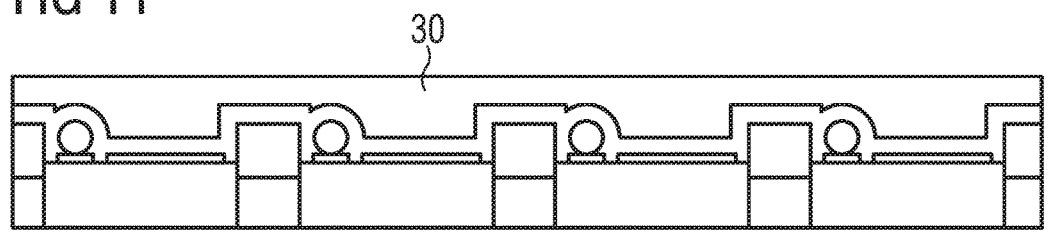
Figure 12:
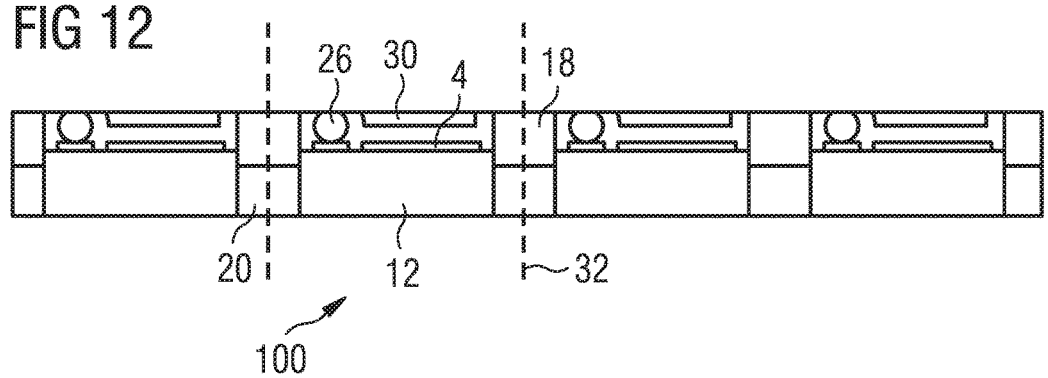

In preparation for planarization, a transparent coating 30 is applied, which may for example consist of silicone (see FIG. 11). In the subsequent method step illustrated in FIG. 12, the transparent coating 30 is planarized by means of a grinding process, wherein the contacting elements 26 are also exposed, such that simple electrical contacting of the semiconductor bodies 4 may proceed through the planarization layer 30. If the contacting elements are dispensed with, for example by applying contact tracks which cover over the scattering layer (see above), the contact to the semiconductor body 4 must be exposed in some other way. Such measures are generally known to a person skilled in the art.

For singulation into semiconductor devices 100, the package body composite and the scattering layer 18 are severed along singulation lines 32. This may for example proceed mechanically, for instance by means of sawing or punching, chemically, for example by means of etching, and/or by means of coherent radiation, for instance by laser ablation. Each semiconductor device 100 comprises a carrier body 12, a semiconductor body 4, a part of the scattering layer 18 and a part of the package body composite 20 as package body.

FIG. 13 shows an exemplary embodiment of an optoelectronic semiconductor device 100, which comprises a semiconductor chip 10 with a semiconductor body 4 arranged on a top 22 of a conductively configured carrier body 12. Furthermore, the semiconductor device 100 comprises a package body 34 which surrounds the carrier body 12 of the semiconductor chip in places in a lateral direction. The top 22 of the carrier body 12 is, when viewed from the semiconductor body 4 in a vertical direction V, arranged in front of the package body 34, in particular in front of a top 38 of the package body 34.

Furthermore, a scattering layer 36 is arranged on the package body 34 which completely surrounds the semiconductor body 4 in a lateral direction.

A vertical distance d between the top 22 of the carrier body and the package body 34, in particular a top 38 of the package body, is greater than 5 µm, preferably greater than 10 µm. It is moreover preferable for it to be smaller than 50 µm, particularly preferably smaller than 25 µm.

Side faces 40 of the package body 34 are not covered by the scattering layer 36. Furthermore, the scattering layer 36 projects beyond the semiconductor body 4 by at least 20 µm in the vertical direction V away from the package body.

The semiconductor body 4 comprises a semiconductor layer sequence with an active region 42 provided for generating and/or receiving radiation which is arranged between a first semiconductor layer 44 and a second semiconductor layer 46.

A contacting element 26 is connected via a contact 6 with a reflective layer 48, which is arranged between the carrier body 12 and the semiconductor body 4 and is electrically conductively connected with the second semiconductor layer 46.

Moreover, at least one recess 50 (preferably a plurality of recesses) is provided, which extends through the reflective layer 48, the second semiconductor layer 46 and the active region 42 into the first semiconductor layer 44 and is at least partly filled with electrically conductive material. The carrier body 12 is connected electrically conductively through the recess 50 with the first semiconductor layer 44.

By applying an electrical voltage between the contacting element 26 and the carrier body 12, charge carriers may be injected into the active region 42 from opposing directions and there recombine with the emission of radiation.

A conversion layer 128 is arranged on the semiconductor body 4, which layer is surrounded laterally by the scattering layer 36 and is configured to convert primary radiation with a first wavelength from the blue region of the spectrum generated in the semiconductor body 4 into secondary radiation with a second wavelength from the yellow region of the spectrum. In this way, mixed light which appears white to the human eye is generated.

The invention is not limited by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:

1. A method for producing a plurality of optoelectronic semiconductor devices, comprising the steps of:
   a) providing an auxiliary carrier;
   b) providing a plurality of semiconductor chips, wherein each of the semiconductor chips comprises a carrier body and a semiconductor body arranged on a top of the carrier body;
   c) mounting the plurality of semiconductor chips on the auxiliary carrier, wherein the semiconductor chips are spaced from one another in a lateral direction, and wherein the semiconductor bodies face the auxiliary carrier when viewed from the carrier body;
   d) forming a scattering layer at least in regions between the semiconductor bodies of adjacent semiconductor chips;

e) forming a package body composite, which is arranged at least in places between the carrier bodies of adjacent semiconductor chips, wherein the tops of the carrier bodies are at a smaller distance from the auxiliary carrier than is the package body composite;

f) removing the auxiliary carrier; and g) singulating the package body composite into a plurality of optoelectronic semiconductor devices, wherein each semiconductor device comprises at least one semiconductor chip, a part of the scattering layer and a part of the package body composite as package body, wherein each of the semiconductor chips provided in step b) comprises a sacrificial layer, which is arranged on the top of the carrier body and covers a side of the semiconductor body remote from the carrier body, and wherein each of the sacrificial layers is removed prior to step g).

2. The method according to claim 1, wherein a vertical distance between the tops of the carrier bodies and the package body composite is greater than 5 μm.

3. The method according to claim 1, wherein the sacrificial layers each have a thickness of at least 20 μm.

4. The method according to claim 1, wherein a conversion layer is formed after step f) and each of the semiconductor devices singulated in step g) comprises a part of the conversion layer.

5. The method according to claim 4, wherein the conversion layer is formed by spray coating.

6. The method according to claim 1, wherein after step f) a plurality of contacting elements is formed, which are each connected electrically conductively with at least one part of the semiconductor bodies and which project beyond the scattering layer in a vertical direction away from the carrier bodies.

7. The method according to claim 1, wherein the semiconductor chips are covered over in step e) and the package body composite is subsequently thinned, such that the carrier bodies are exposed in places.

8. An optoelectronic semiconductor device comprising:
a semiconductor chip provided for generating and/or receiving radiation with a semiconductor body arranged on a top of a carrier body;
a package body which surrounds the carrier body of the semiconductor chip in places in a lateral direction, wherein the top of the carrier body is arranged in front of the package body when viewed in a vertical direction down towards the semiconductor body; and
a scattering layer which completely surrounds the semiconductor body in a lateral direction is arranged on the package, wherein the semiconductor device is produced according to the method of claim 1.

9. An optoelectronic semiconductor device comprising:
a semiconductor chip provided for generating and/or receiving radiation with a semiconductor body arranged on a top of a carrier body;
a package body which surrounds the carrier body of the semiconductor chip in places in a lateral direction, wherein the top of the carrier body is arranged in front of the package body and the semiconductor body is arranged in front of the carrier body, when viewed in a vertical direction down towards the semiconductor body; and
a scattering layer which completely surrounds the semiconductor body in a lateral direction is arranged on the package body, wherein the semiconductor chip is configured to generate radiation by recombination of charge carriers in an active region of the semiconductor body when the semiconductor device is in operation, and wherein the package body is completely absorbent for the radiation generated by the semiconductor chip when the semiconductor device is in operation.

10. The optoelectronic semiconductor device according to claim 9, wherein a vertical distance between the top of the carrier body and the package body is greater than 5 μm.

11. The optoelectronic semiconductor device according to claim 9, wherein side faces of the package body are not covered by the scattering layer.

12. The optoelectronic semiconductor device according to claim 9, wherein the scattering layer projects beyond the semiconductor body by at least 20 μm in a vertical direction away from the package body.

13. The optoelectronic semiconductor device according to claim 9, which comprises a conversion layer, wherein the scattering layer surrounds the conversion layer in a lateral direction at least in places.

14. A method for producing a plurality of optoelectronic semiconductor devices, comprising the steps of:

a) providing an auxiliary carrier;

b) providing a plurality of semiconductor chips, wherein each of the semiconductor chips comprises a carrier body and a semiconductor body arranged on a top of the carrier body;

c) mounting the plurality of semiconductor chips on the auxiliary carrier, wherein the semiconductor chips are spaced from one another in a lateral direction and wherein the semiconductor bodies face the auxiliary carrier when viewed from the carrier body;

d) forming a scattering layer at least in regions between the semiconductor bodies of adjacent semiconductor chips;

e) forming a package body composite, which is arranged at least in places between the carrier bodies of adjacent semiconductor chips, wherein the tops of the carrier bodies are each located at a distance from the auxiliary carrier that is smaller than a shortest distance between the package body composite and the auxiliary carrier;

f) removing the auxiliary carrier; and g) singulating the package body composite into a plurality of optoelectronic semiconductor devices, wherein each semiconductor device comprises at least one semiconductor chip, a part of the scattering layer and a part of the package body composite as package body, wherein each semiconductor chip is configured to generate radiation by recombination of charge carriers in an active region of the semiconductor body when the semiconductor device is in operation, and wherein the package body is completely absorbent for the radiation generated by the semiconductor chip when the semiconductor device is in operation.

* * * * *